(12) United States Patent
Choi et al.

(10) Patent No.: US 10,529,774 B1
(45) Date of Patent: Jan. 7, 2020

(54) MAGNETIC RANDOM ACCESS MEMORY

(71) Applicant: KOREA INSTITUTE OF SCIENCE AND TECHNOLOGY, Seoul (KR)

(72) Inventors: Gyung-Min Choi, Gyeonggi-do (KR); Byoung-Chul Min, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/134,523

(22) Filed: Sep. 18, 2018

(30) Foreign Application Priority Data

Jun. 22, 2018 (KR) ........................ 10-2018-0072127

(51) Int. Cl.
| | | |
|---|---|---|
| *H01L 27/22* | (2006.01) | |
| *H01L 43/08* | (2006.01) | |
| *G11C 11/16* | (2006.01) | |
| *H01L 43/02* | (2006.01) | |
| *H01L 43/10* | (2006.01) | |

(52) U.S. Cl.
CPC .......... *H01L 27/222* (2013.01); *G11C 11/161* (2013.01); *H01L 27/226* (2013.01); *H01L 43/02* (2013.01); *H01L 43/08* (2013.01); *H01L 43/10* (2013.01)

(58) Field of Classification Search
CPC ... H01L 27/222; H01L 27/224; H01L 27/226; H01L 43/02; H01L 43/08; H01L 43/10; G11C 11/161
See application file for complete search history.

(56) References Cited

U.S. PATENT DOCUMENTS

| | | | | |
|---|---|---|---|---|
| 8,531,876 | B2* | 9/2013 | Lou ..................... | G11C 11/1693 365/148 |
| 10,199,083 | B1* | 2/2019 | Bozdag ............... | G11C 11/1659 |
| 2011/0014500 | A1* | 1/2011 | Horng ................. | C23C 14/3414 428/846.3 |
| 2012/0281467 | A1* | 11/2012 | Abraham ............. | G11C 11/161 365/171 |
| 2014/0247653 | A1* | 9/2014 | Wang .................... | H01L 43/08 365/158 |
| 2016/0035401 | A1* | 2/2016 | Kent .................... | H01L 43/08 365/158 |
| 2016/0064651 | A1* | 3/2016 | Guo ...................... | H01L 43/08 257/421 |
| 2018/0033954 | A1* | 2/2018 | Aradhya ............... | H01L 43/06 |

* cited by examiner

*Primary Examiner* — Stephen W Smoot
(74) *Attorney, Agent, or Firm* — Mendelsohn Dunleavy, P.C.

(57) ABSTRACT

The present invention relates to a magnetic RAM including a memory cell, the memory cell including a metal layer, a magnetic tunnel junction layer storing predefined information by causing a magnetization direction to be up or down, a spin-current transfer layer transferring spin current to the magnetic tunnel junction layer, a spin-current generation layer generating the spin current, and a thermal electron injection layer injecting thermal electrons into the spin-current generation layer, and the magnetization direction may be changed due to spin transfer torque generated in the magnetic tunnel junction layer, whereby it is possible to reduce current density consumed for switching the magnetization direction of the free magnetic sub-layer in the magnetic tunnel junction layer.

16 Claims, 6 Drawing Sheets

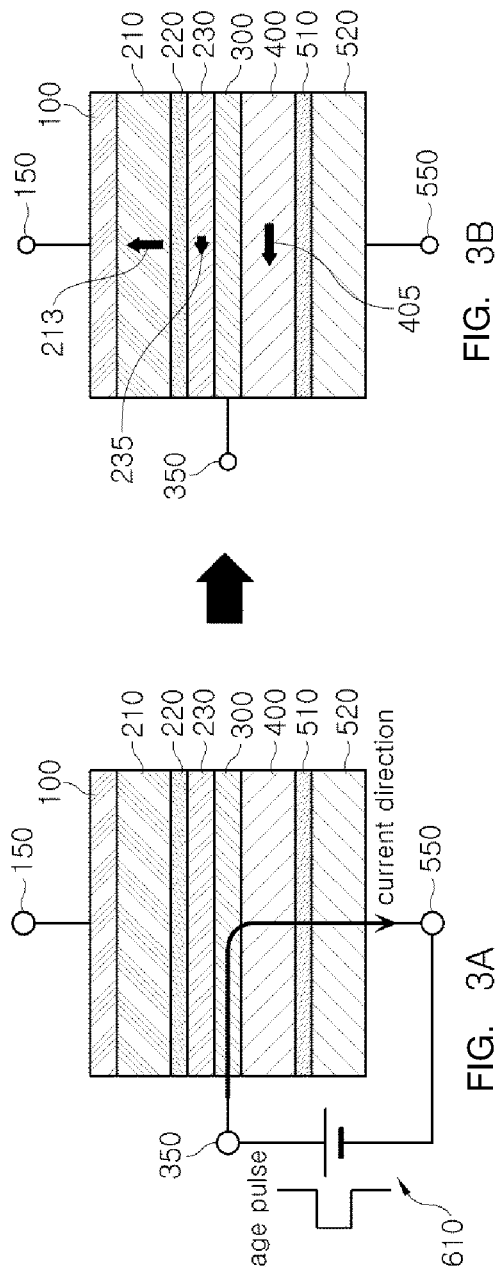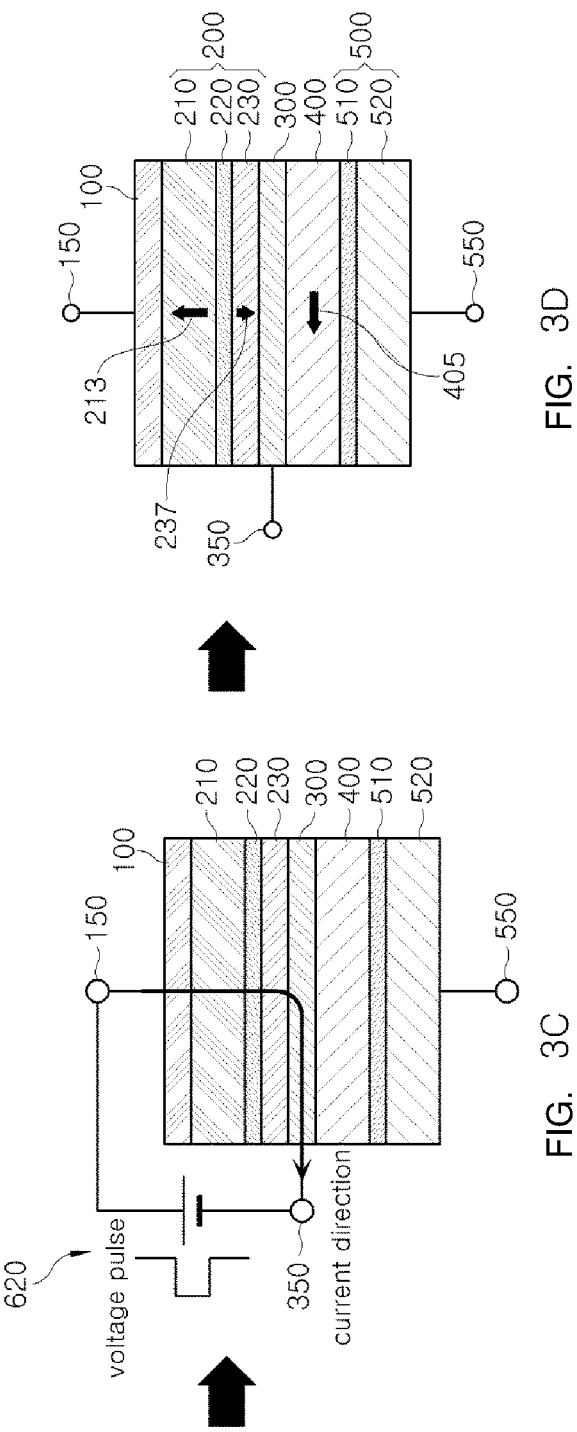

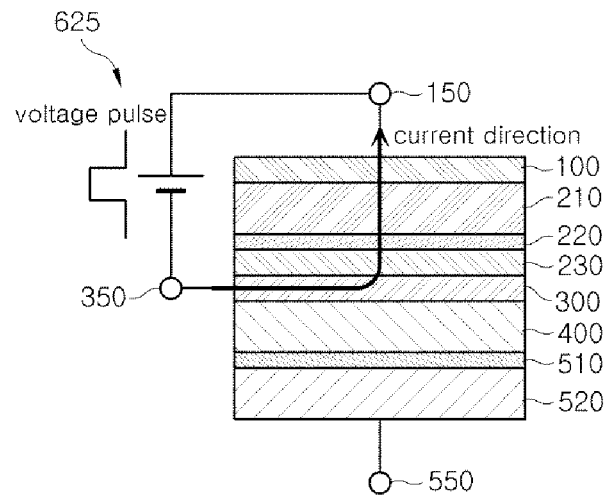
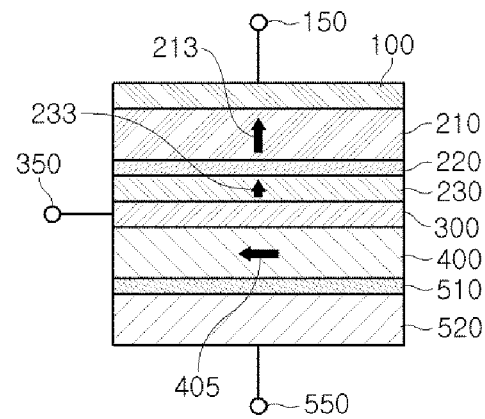
FIG. 5A    FIG. 5B
FIG. 6
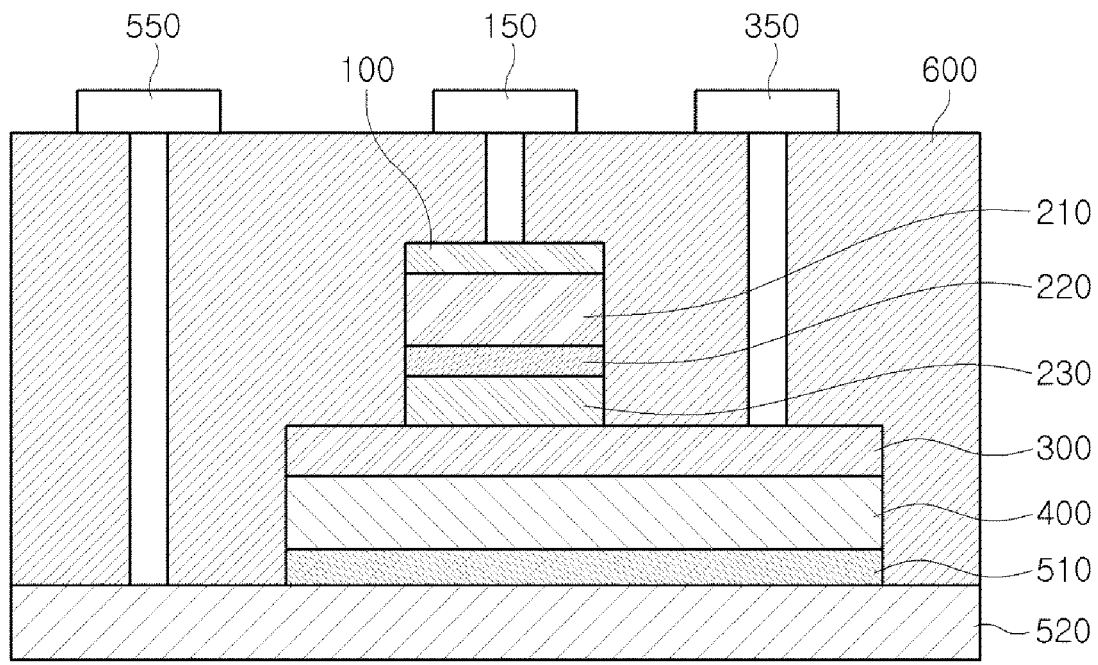

MAGNETIC RANDOM ACCESS MEMORY

CROSS REFERENCE TO RELATED APPLICATION

The present application claims priority to Korean Patent Application No. 10-2018-0072127, filed Jun. 22, 2018, the entire contents of which is incorporated herein for all purposes by this reference.

BACKGROUND OF THE INVENTION

Field of the Invention

The present invention relates to a magnetic random access memory (MRAM), and more particularly to a magnetic RAM that is capable of decreasing the current density required for switching while reducing the time consumed for switching.

Description of the Related Art

Today, computers are widely used in many fields. In such a computer, a RAM (Random Access Memory) is widely used as one of storage devices for storing or reading a variety of information. New technologies have been proposed to compensate for the drawbacks of RAM, one thereof being a magnetic random access memory (MRAM).

The magnetic RAM is one of the next-generation memory technologies, and can store a variety of information according to the magnetization direction of a magnet. In order to store information in the magnetic RAM, the magnetization direction of a free magnetic layer is switched in such a manner as to be the upward or downward direction. Current-driven spin transfer torque is used to switch the magnetization direction of the free magnetic layer.

As current passes through a fixed magnetic layer, the spinning directions of electrons are aligned in the magnetization direction of the fixed magnetic layer. The spin-aligned electrons tunnel through an insulating layer and enter the free magnetic layer.

Herein, when the directions in which the electrons spin are different from the magnetization direction of the free magnetic layer, the magnetization direction of the free magnetic layer is rotated. This phenomenon is referred to as a spin transfer torque.

In the related art, current is applied to generate the spin transfer torque, which can be referred to as a current-driven spin transfer torque.

The magnetic RAM according to this related art has the following problems.

When switching the magnetic RAM using the current-driven spin transfer torque, more current density is required to reduce the time consumed for switching. The increased current density causes various problems, such as a problem in which a transistor having a small size cannot be used, a problem in that the amount of electric power that is consumed increases, and a problem in that the reliability of an insulating layer is lowered.

Therefore, there is a demand for a magnetic RAM technique that enables the current density required for switching to be reduced while also reducing the time taken for switching.

SUMMARY OF THE INVENTION

Accordingly, the present invention has been made keeping in mind the above problems occurring in the related art, and an object of the present invention is to provide a magnetic RAM capable of switching the magnetization direction at a small current density to record or store various information by decreasing the current density required to switch the magnetization direction.

In order to achieve the above-mentioned object, according to an embodiment of the present invention, there is provided a magnetic RAM including a memory cell, the memory cell including: a metal layer provided with a first electrode terminal for receiving a voltage pulse applied from an outside; a magnetic tunnel junction layer disposed in contact with a lower surface of the metal layer to store predefined information by causing a magnetization direction of at least a part thereof to be up or down; a spin-current transfer layer disposed in contact with a lower surface of the magnetic tunnel junction layer and provided with a second electrode terminal for receiving a voltage pulse applied from the outside to transfer spin current to the magnetic tunnel junction layer; a spin-current generation layer disposed in contact with a lower surface of the spin-current transfer layer to generate the spin current to be transferred to the magnetic tunnel junction layer through the spin-current transfer layer; and a thermal electron injection layer disposed in contact with a lower surface of the spin-current generation layer and provided with a third electrode terminal for receiving a voltage pulse applied from the outside to inject thermal electrons into the spin-current generation layer so that the spin current is generated in the spin-current generation layer, wherein the magnetization direction of at least a part of the magnetic tunnel junction layer is changed due to a spin transfer torque generated in at least the part of the magnetic tunnel junction layer by the spin current.

Herein, the metal layer or the spin-current transfer layer may be configured to include a non-magnetic metal.

Furthermore, the magnetic tunnel junction layer may include a fixed magnetic sub-layer including a magnetic metal; a free magnetic sub-layer provided below the fixed magnetic sub-layer and including a magnetic metal; and an insulating sub-layer located between the fixed magnetic sub-layer and the free magnetic sub-layer to insulate the fixed magnetic sub-layer and the free magnetic sub-layer from each other.

Furthermore, the fixed magnetic sub-layer may be any one of FePt having a face-centered tetragonal (FCT) crystal structure, FePd having an FCT crystal structure, CoPt having an FCT crystal structure, $[Co/Pt]_N$ of a multi-layer thin film structure, $[Co/Pd]_N$ of a multi-layer thin film structure, $[Co/Ni]_N$ of a multi-layer thin film structure, CoFeB/Ta of a bi-layer structure, CoFeB/W of a bi-layer structure, and CoFeB/Hf of a bi-layer structure.

In addition, the free magnetic sub-layer may be any one of FePt having an FCT crystal structure, FePd having an FCT crystal structure, CoPt having an FCT crystal structure, $[Co/Pt]_N$ of a multilayer thin film structure, $[Co/Pd]_N$ of a multilayer thin film structure, $[Co/Ni]_N$ of a multilayer thin film structure, CoFeB/Ta of a bi-layer structure, CoFeB/W of a bi-layer structure, and CoFeB/Hf of a bi-layer structure.

In addition, the thermal electron injection layer may include a base insulating layer disposed in contact with a lower surface of the spin-current generation layer; and a non-magnetic metal base layer provided below the base insulating layer and including a non-magnetic metal.

Furthermore, the spin-current generation layer is a magnetic metal layer including a magnetic metal.

Furthermore, a magnetization direction of the fixed magnetic sub-layer may be perpendicular to a magnetization direction of the spin-current generation layer.

Furthermore, the spin-current generation layer may be any one of Co, Fe, Ni, a CoFe alloy, a NiFe alloy, a CoFeAl alloy, a CoAl alloy, and a CoFeB alloy.

In addition, the spin current generated in the spin-current generation layer by a voltage pulse applied via the third electrode terminal and the second electrode terminal may be transferred to the free magnetic sub-layer through the spin-current transfer layer so that the spin current torque is generated in the free magnetic sub-layer.

In addition, the spin current generated in the spin-current generation layer by the voltage pulse applied via the third electrode terminal and the first electrode terminal may be transferred to the free magnetic sub-layer through the spin-current transfer layer so that the spin current torque is generated in the free magnetic sub-layer.

Herein, the voltage pulse may be applied through the first electrode terminal and the second electrode terminal to allow the current-driven spin transfer torque due to current flowing from the first electrode terminal to the second electrode terminal to be applied to the free magnetic sub-layer, so that the magnetization direction of the free magnetic sub-layer is a downward direction.

Herein, the voltage pulse may be applied through the first electrode terminal and the second electrode terminal to allow the current-driven spin transfer torque due to current flowing from the second electrode terminal to the first electrode terminal to be applied to the free magnetic sub-layer, so that the magnetization direction of the free magnetic sub-layer is an upward direction.

Herein, the memory cell may further include an electrode-insulating layer disposed between the first electrode terminal, the second electrode terminal, and the third electrode terminal so that the first electrode terminal, the second electrode terminal, and the third electrode terminal are insulated from each other so as to prevent current from directly flowing therebetween.

The magnetic RAM according to the present invention has an advantage in that the current density required for switching the magnetization direction of the free magnetic sub-layer is reduced.

In addition, it is possible to reduce a failure, realize high speed switching, and avoid interference in the write/read operations, whereby there is an advantage in that the accuracy and reliability of the magnetic RAM are increased.

BRIEF DESCRIPTION OF THE DRAWINGS

The above and other objects, features and other advantages of the present invention will be more clearly understood from the following:

FIGS. 3A to 3D are schematic diagrams illustrating a sequential state of memory cells included in a magnetic RAM in order to explain a write operation of the magnetic RAM according to an embodiment of the present invention;

FIGS. 5A and 5B are schematic diagrams illustrating the application of a voltage pulse to a memory cell and magnetization directions in a write operation of a magnetic RAM according to an embodiment of the present invention;

FIG. 6 is a schematic diagram illustrating an exemplary configuration of one memory cell in a magnetic RAM according to an embodiment of the present invention.

DETAILED DESCRIPTION OF THE INVENTION

Hereinafter, preferred embodiments of the present invention will be described in detail with reference to the accompanying drawings.

Figure 1:
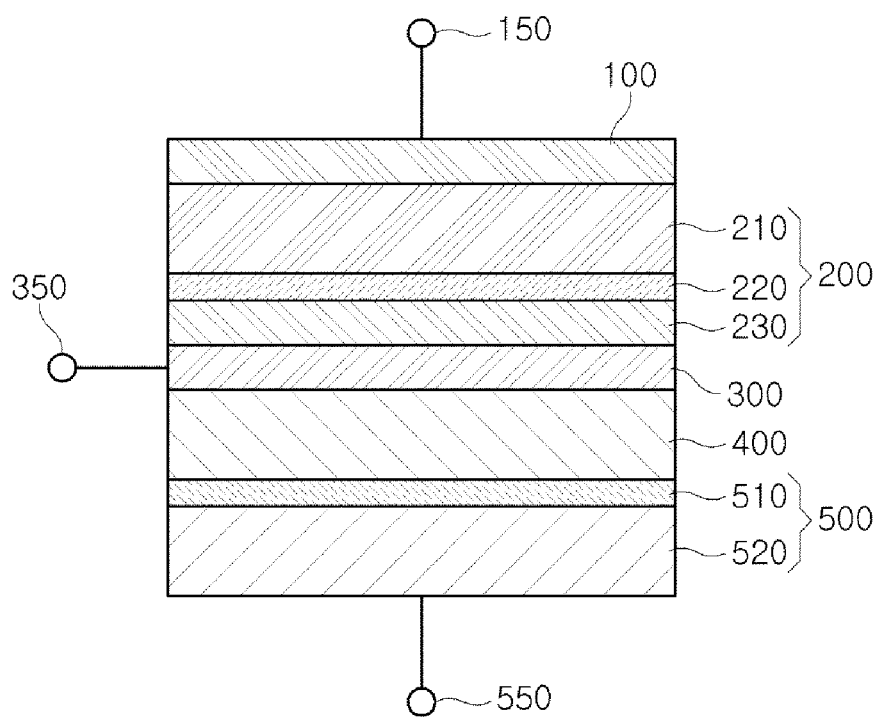
FIG. 1 is a schematic diagram illustrating a memory cell included in a magnetic RAM according to an embodiment of the present invention.
Figure 2:
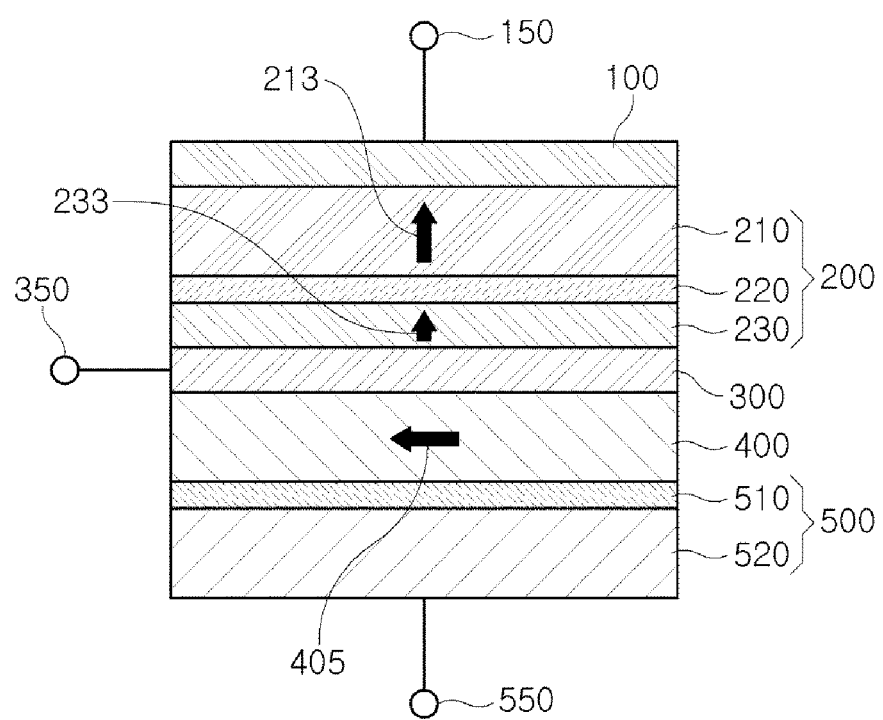
FIG. 2 is a schematic diagram illustrating a magnetization direction of a part of a memory cell included in a magnetic RAM according to an embodiment of the present invention.
Figure 4:
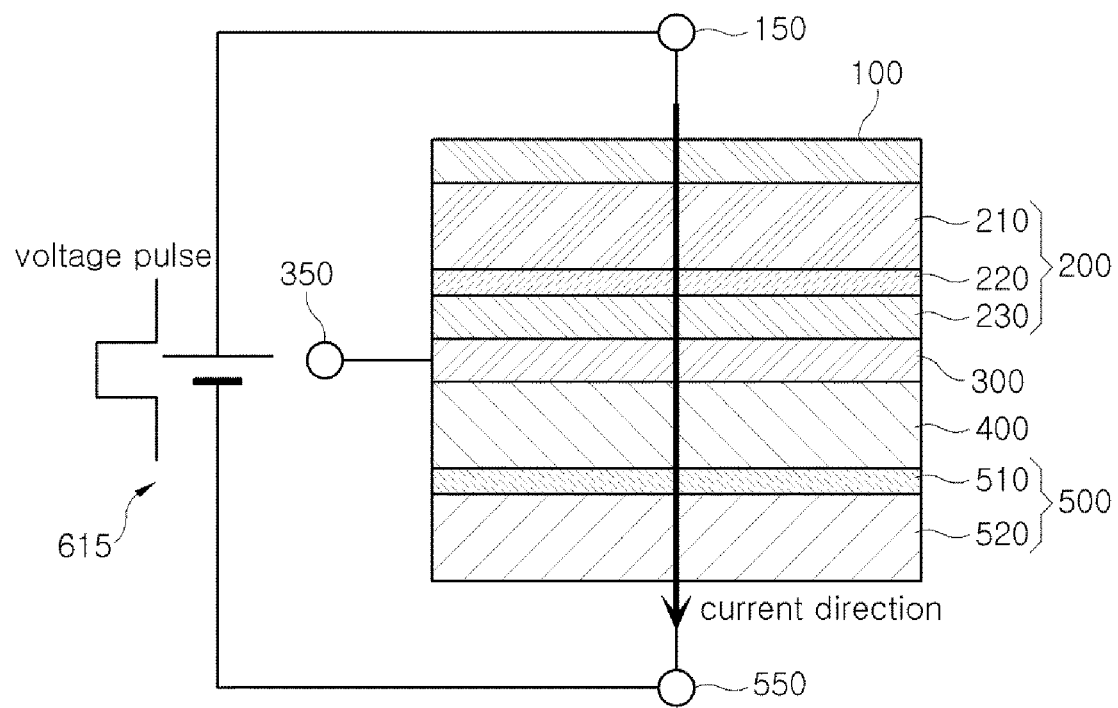
FIG. 4 is a schematic diagram illustrating application of a voltage pulse to a memory cell in a write operation of a magnetic RAM according to an embodiment of the present invention.
Figure 7:
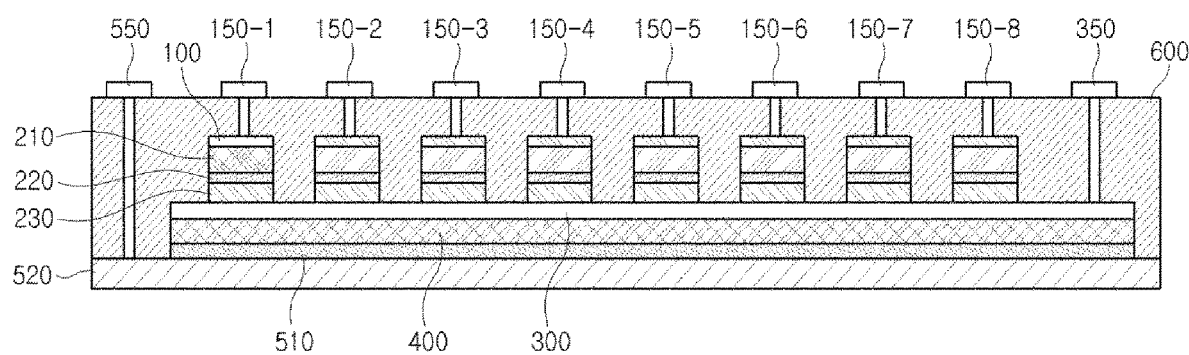
FIG. 7 is a schematic diagram illustrating an exemplary configuration of a plurality of memory cells in a magnetic RAM according to an embodiment of the present invention.

FIG. 1 is a schematic diagram illustrating a memory cell included in a magnetic RAM according to an embodiment of the present invention; FIG. 2 is a schematic diagram illustrating a magnetization direction of a part of a memory cell included in a magnetic RAM according to an embodiment of the present invention; FIGS. 3A to 3D are schematic diagrams illustrating a sequential state of memory cells included in a magnetic RAM in order to explain a write operation of the magnetic RAM according to an embodiment of the present invention; FIG. 4 is a schematic diagram illustrating application of a voltage pulse to a memory cell in a write operation of a magnetic RAM according to an embodiment of the present invention; FIGS. 5A and 5B are schematic diagrams illustrating the application of a voltage pulse to a memory cell and magnetization directions in a write operation of a magnetic RAM according to an embodiment of the present invention; FIG. 6 is a schematic diagram illustrating an exemplary configuration of one memory cell in a magnetic RAM according to an embodiment of the present invention; and FIG. 7 is a schematic diagram illustrating an exemplary configuration of a plurality of memory cells in a magnetic RAM according to an embodiment of the present invention.

First, referring to FIG. 1, a magnetic RAM according to an embodiment of the present invention is configured to include a memory cell, in which the memory cell includes a metal layer, a magnetic tunnel junction layer, a spin-current transfer layer, a spin-current generation layer, and a thermal electron injection layer, and may further include an electrode-insulating layer.

In the embodiment of the present invention, the metal layer 100 is located at an upper portion of the memory cell of the magnetic RAM and is provided with a first electrode terminal 150 for receiving a voltage pulse applied from a power source outside of the memory cell. The metal layer 100 is preferably configured to include a non-magnetic metal. Therefore, more specifically, the metal layer 100 may be referred to as a non-magnetic metal layer. The first electrode terminal 150 is provided to receive voltage pulses for switching the magnetization direction 233 of a free magnetic sub-layer 230, which will be described later.

The magnetic tunnel junction layer 200 is disposed in contact with the lower surface of the metal layer 100, as shown in FIG. 1. The magnetization direction of at least a part of the magnetic tunnel junction layer 200 points up or down so that predefined information may be stored.

The magnetic tunnel junction layer 200 may be configured to include three sub-layers. That is, a fixed magnetic sub-layer 210, a free magnetic sub-layer 230, and an insulating sub-layer 220 are included in the magnetic tunnel junction layer 200. The fixed magnetic sub-layer 210, the insulating sub-layer 220, and the free magnetic sub-layer 230 serve as magnetic tunnel junctions.

The fixed magnetic sub-layer 210 includes a metal magnetic material and is disposed at an upper portion of the magnetic tunnel junction layer 200, as shown in FIG. 1. The insulating sub-layer 220 and the free magnetic sub-layer 230 are disposed below the fixed magnetic sub-layer 210.

It is preferable that the magnetization direction of the fixed magnetic sub-layer 210 be maintained in a fixed state.

It is preferable that the magnetization direction of the fixed magnetic sub-layer 210 be perpendicular to the magnetization direction of a spin-current generation layer 400, which will be described later.

The fixed magnetic sub-layer 210 is preferably one of FePt having a face-centered tetragonal (FCT) crystal structure, FePd having an FCT crystal structure, CoPt having an FCT crystal structure, $[Co/Pt]_N$ of a multi-layer thin film structure, $[Co/Pd]_N$ of a multi-layer thin film structure, $[Co/Ni]_N$ of a multi-layer thin film structure, CoFeB/Ta of a bi-layer structure, CoFeB/W of a bi-layer structure, and CoFeB/Hf of a bi-layer structure.

The free magnetic sub-layer 230 is disposed below the fixed magnetic sub-layer 210, and more specifically, below the insulating sub-layer 220, which is disposed below the fixed magnetic sub-layer 210.

The free magnetic sub-layer 230 is preferably configured to include a magnetic metal.

The free magnetic sub-layer 230 stores predefined information by changing the magnetization direction thereof.

In addition, the free magnetic sub-layer 230 is preferably formed such that the magnetization direction 233 thereof is perpendicular to the magnetization direction 405 of the spin-current generation layer 400, in which the magnetization direction 233 may be switched due to a voltage pulse applied from the outside.

A more detailed description on switching, in which the magnetization direction 233 of the free magnetic sub-layer 230 is switched, will be provided later.

The free magnetic sub-layer 230 is preferably one of FePt having an FCT crystal structure, FePd having an FCT crystal structure, CoPt having an FCT crystal structure, Co/Pt of a multilayer thin film structure, Co/Pd of a multilayer thin film structure, Co/Ni of a multilayer thin film structure, CoFeB/Ta of a bi-layer structure, CoFeB/W of a bi-layer structure, and CoFeB/Hf of a bi-layer structure.

The insulating sub-layer 220 is located between the fixed magnetic sub-layer 210 and the free magnetic sub-layer 230, so that the fixed magnetic sub-layer 210 and the free magnetic sub-layer 230 are not in direct contact with each other. The insulating sub-layer 220 serves as a tunnel barrier, and may be made of magnesium oxide, aluminum oxide, or the like.

The magnetic tunnel junction layer 200 including the fixed magnetic sub-layer 210, the insulating sub-layer 220, and the free magnetic sub-layer 230 is preferably provided such that the magnetization direction in at least one part thereof may be changed by spin transfer torque caused due to spin current transferred from the spin-current generation layer 400, which will be described later.

The spin-current transfer layer 300 is disposed in contact with the lower surface of the magnetic tunnel junction layer 200. A second electrode terminal 350 for receiving a voltage pulse from a power source external to the magnetic RAM is provided in the spin-current transfer layer 300 and transfers the spin current to the magnetic tunnel junction layer 200.

That is, the spin current generated in the spin-current generation layer 400 is transferred to the free magnetic sub-layer 230. The spin-current transfer layer 300 is preferably configured to include a non-magnetic metal.

The spin-current generation layer 400 is disposed in contact with the lower surface of the spin-current transfer layer 300, and generates a spin current to be transferred to the magnetic tunnel junction layer 200 through the spin-current transfer layer 300.

The spin-current generation layer 400 is preferably a magnetic metal layer including a magnetic metal.

The magnetization direction 405 of the spin-current generation layer 400 is preferably perpendicular to the respective magnetization directions 213 and 233 of the fixed magnetic sub-layer 210 and the free magnetic sub-layer 230.

For this purpose, as shown in FIG. 2, the magnetization direction 405 of the spin-current generation layer 400 is oriented parallel to a plate-shaped thin film, and the respective magnetization directions 233 and 213 of the free magnetic sub-layer 230 and the fixed magnetic sub-layer 210 are preferably perpendicular to the magnetization direction of the spin-current generation layer 400.

Herein, in order to increase the integration density of the memory cell in the magnetic RAM, it is preferable to use perpendicular magnetization material for the free magnetic sub-layer 230 and the fixed magnetic sub-layer 210. Specifically, it is preferable to use perpendicular magnetization material, which is larger in magnetic anisotropy energy per unit volume than in-plane magnetization material, because the larger the magnetic anisotropy energy per unit volume, the greater the integration density.

Using the in-plane magnetization material in the spin-current generation layer 400 enables the magnetization direction 405 of the spin-current generation layer 400 and the magnetization direction 213 of the free magnetic sub-layer 230 to be perpendicular to each other. Setting the magnetization directions to be perpendicular to each other is preferable because the thermal spin transfer torque may be most efficiently transferred from the spin-current generation layer 400 to the free magnetic sub-layer 230.

The spin-current generation layer 400 may be preferably any one of Co, Fe, Ni, a CoFe alloy, a NiFe alloy, a CoFeAl alloy, a CoAl alloy, and a CoFeB alloy.

The thermal electron injection layer 500 is disposed in contact with the lower surface of the spin-current generation layer 400.

In addition, a third electrode terminal 550 for receiving voltage pulses applied from a power source external to the magnetic RAM is provided to inject thermal electrons to the spin-current generation layer 400 so that the spin current may be generated in the spin-current generation layer 400.

The thermal electron injection layer 500 is preferably configured to include a base insulating layer 510 and a non-magnetic metal base layer 520.

The base insulating layer 510 is located at the upper portion of the thermal electron injection layer 500 and is in contact with the lower surface of the spin-current generation layer 400. The base insulating layer 510 serves as a tunnel barrier, and is preferably made of magnesium oxide or aluminum oxide.

In addition, the non-magnetic metal base layer 520 is disposed in contact with the lower surface of the base insulating layer 510 and is provided with the third electrode terminal 550 for receiving voltage pulses applied from an external power source. The non-magnetic metal base layer 520 is preferably configured to include a non-magnetic metal.

The non-magnetic metal base layer 520 and the base insulating layer 510 serve to inject thermal electrons into the spin-current generation layer 400. When the thermal electrons are injected into the spin-current generation layer 400, the thermal electrons are converted into the spin current in the spin-current generation layer 400.

The operation of the magnetic RAM according to the embodiment of the present invention as described above will now be described with reference to FIGS. 3 to 5.

In the magnetic RAM according to the embodiment of the present invention, the write operation of the memory cell, that is, the process of switching the magnetization direction 233 of the free magnetic sub-layer 230, is caused due to a combination of two voltage pulses.

First, starting from the initial state shown in FIG. 2, a first voltage pulse 610 is applied so that thermal electrons are injected into the spin-current generation layer 400 as shown in FIG. 3A.

That is, the spin current generated in the spin-current generation layer 400 by the voltage pulse 610 applied through the third electrode terminal 550 and the second electrode terminal 350 is transferred to the free magnetic sub-layer 230 through the spin-current transfer layer 300, so that spin transfer torque is generated in the free magnetic sub-layer 230.

More specifically, the voltage pulse 610 is applied through the second electrode terminal 350 and the third electrode terminal 550. Here, the applied voltage pulse 610 is preferably 1 V or more.

When a voltage pulse 610 of 1 V or more is applied, thermal electrons having energy of 1 eV or more are injected from the non-magnetic metal base layer 520 into the spin-current generation layer 400 by tunneling through the base insulating layer 510.

The spin-current generation layer 400 converts the thermal electrons into the spin current by electron-magnon coupling.

The spin current generated due to the conversion of the thermal electrons is transferred to the spin-current transfer layer 300. The spin-current transfer layer 300 transfers the spin current to the free magnetic sub-layer 230. The spin transfer torque is generated by the spin current transferred to the free magnetic sub-layer 230.

Here, the spin transfer torque may be referred to as thermal spin transfer torque in that the spin transfer torque is generated by the spin current generated by the thermal electrons.

When sufficient thermal spin transfer torque is generated, the magnetization direction 233 of the free magnetic sub-layer 230, which is the perpendicular direction, is rotated into the in-plane magnetization direction 235 as shown in FIG. 3B.

When the magnetization direction 235 of the free magnetic sub-layer 230 is rotated into the in-plane direction, a secondary voltage pulse is applied so that to the in-plane magnetization direction 235 of the free magnetic sub-layer 230 is selectively switched to be the perpendicular magnetization direction 233 or 237.

Meanwhile, although the first voltage pulse may be applied through the second electrode terminal 350 and the third electrode terminal 550 as described above, it is also possible to apply the first voltage pulse 615 through the first electrode terminal 150 and the third electrode terminal 550, as shown in FIG. 4.

As shown in FIG. 4, even when the voltage pulse 615 is applied through the first electrode terminal 150 and the third electrode terminal 550, the process in which the magnetization direction 233 is changed in the free magnetic sub-layer 230 is the same as that described above.

Accordingly, the spin current generated in the spin-current generation layer 400 by the voltage pulse 615 applied through the third electrode terminal 550 and the first electrode terminal 150 is transferred to the free magnetic sub-layer 230 through the spin-current transfer layer 300 so that a spin transfer torque is preferably generated in the free magnetic sub-layer 230.

A description will be hereinafter provided of the process in which the second voltage pulse 620 is then applied to complete the switching of the in-plane magnetization direction 235 in the free magnetic sub-layer 230.

As shown in FIG. 3C, as an example of the second step of the write operation into the memory cell in the magnetic RAM according to the embodiment of the present invention, the second voltage pulse 620 is applied through the second electrode terminal 350 and the first electrode terminal 150. Here, the magnetization direction 213 of the fixed magnetic sub-layer 210 is a direction perpendicular to the magnetization direction 405 of the spin-current generation layer 400 or a direction perpendicular to the plane of the thin film, as described above.

In addition, as shown in FIG. 3C, current flows from the first electrode terminal 150 to the second electrode terminal 350. Due to this current, the spin transfer torque is applied to the free magnetic sub-layer 230. Here, the spin transfer torque is caused by the current, and thus it may be referred to as current-driven spin transfer torque.

The current-driven spin transfer torque causes the magnetization direction of the free magnetic sub-layer 230 to be switched into a downward direction 237 as shown in FIG. 3D. That is, the magnetization direction of the free magnetic sub-layer 230 is switched into the downward direction 237, which is perpendicular to the magnetization direction 405 of the spin-current generation layer 400.

Thus, the final switching magnetization direction of the free magnetic sub-layer 230 is the downward direction 237.

Accordingly, the voltage pulse is applied through the first electrode terminal 150 and the second electrode terminal 350 to allow the current-driven spin transfer torque due to current flowing from the first electrode terminal 150 to the second electrode terminal 350 to be applied to the free magnetic sub-layer 230, so that the magnetization direction of the free magnetic sub-layer 230 is the downward direction 237.

On the other hand, the process in which the magnetization direction of the free magnetic sub-layer 230 is finally switched into the upward magnetization direction 233 is as follows.

As shown in FIG. 5A, a voltage pulse 625 is applied across the first electrode terminal 150 and the second electrode terminal 350, the current being applied to flow from the second electrode terminal 350 to the first electrode terminal 150.

Herein, the magnetization direction 213 of the fixed magnetic sub-layer 210 is perpendicular to the magnetization direction 405 of the spin-current generation layer 400, as described above. Of course, since the magnetization direction 405 of the spin-current generation layer 400 is parallel to the plane of the thin film, it may be noted that the magnetization direction 213 of the fixed magnetic sub-layer 210 is perpendicular to the plane of the thin film.

A current-driven spin transfer torque is applied to the free magnetic sub-layer 230 due to the current flowing from the second electrode terminal 350 to the first electrode terminal 150. As shown in FIG. 5B, the current-driven spin transfer torque causes the magnetization direction of the free magnetic sub-layer 230 to be rotated into the upward direction 233, perpendicular to the plane of the thin film.

Therefore, the final magnetization direction of the free magnetic sub-layer 230 is the upward direction, which is perpendicular to the magnetization direction 405 of the spin-current generation layer 400.

As described above, the voltage pulse is applied through the first electrode terminal 150 and the second electrode terminal 350, so that the current-driven spin transfer torque due to current flowing from the second electrode terminal 350 to the first electrode terminal 150 is applied to the free magnetic sub-layer 230 to cause the magnetization direction of the free magnetic sub-layer 230 to be the upward magnetization direction.

In summary, it may be noted that the switching of the magnetization direction in the free magnetic sub-layer 230 is determined by the flow direction of the current applied by the second voltage pulse 620 or 625.

A read operation of the memory cell in the magnetic RAM according to the embodiment of the present invention is performed by a single voltage pulse between the second electrode terminal 350 and the first electrode terminal 150. In this case, the voltage pulse is not applied between the third electrode terminal 550 and the second electrode terminal 350. Therefore, it is possible to avoid the probability of a failure in which a write operation is performed during a read operation.

A more detailed description will be made with reference to FIGS. 6 and 7.

As shown in FIG. 6, the first electrode terminal 150 to the third electrode terminal 550 of the memory cell in the magnetic RAM according to the present invention may be arranged. Herein, the electrode-insulating layer 600 is disposed between the first electrode terminal 150, the second electrode terminal 350, and the third electrode terminal 550. The electrode-insulating layer 600 is provided to allow the first electrode terminal 150, the second electrode terminal 350, and the third electrode terminal 550 to be insulated from each other so that current does not directly flow therebetween.

The electrode-insulating layer 600 is a passivation insulator, and is preferably formed of a material such as $Si_3N_4$, $SiO_2$, $Al_2O_3$, or $Ta_2O_5$.

As shown in FIG. 6, the first electrode terminal 150 is connected to the upper metal layer 100, the second electrode terminal 350 is connected to the spin-current transfer layer 300, and the third electrode terminal 550 is connected to the non-magnetic metal base layer 520. As shown in FIG. 6, the areas of each layer are different from each other, so that the electrode terminals may be easily formed on each layer or connected to each layer.

The area of the spin-current transfer layer 300 may be formed to be larger than the areas of the metal layer 100, the magnetic tunnel junction layer 200, the fixed magnetic sub-layer 210, the insulating sub-layer 220, and the free magnetic sub-layer 230, so that the second electrode terminal 350 is connected to one surface of the spin-current transfer layer 300.

Similarly, the area of the non-magnetic metal base layer 520 is formed to be larger than the areas of the spin-current generation layer 400, the thermal electron injection layer 500, and the base insulating layer 510 formed thereon, so that the non-magnetic metal base layer 520 may be connected to the third electrode terminal 550 at one surface thereof. An electrode-insulating layer 600 is formed between the first electrode terminal 150, the second electrode terminal 350, and the third electrode terminal 550 to insulate each electrode terminal from the others and at the same time to support each electrode terminal.

According to the related art, using only current-driven spin transfer torque, about 300 fJ of energy is used to operate one memory cell. However, according to the present invention, energy of 100 fJ is used to generate the thermal spin transfer torque, so that the energy for generating the sufficient current-driven spin transfer torque may be reduced to ⅕ of the existing 300 fJ. Therefore, the memory cell may be operated with only the energy of 160 fJ, obtained by adding the current-driven spin transfer torque energy of 60 fJ (=300 fJ/5) to the thermal spin transfer torque energy of 100 fJ.

Here, a magnetic RAM including a plurality of memory cells may be formed by arranging, in multiples, the memory cells of the magnetic RAM having the structure shown in FIG. 6. That is, the memory cell shown in FIG. 6 may be arranged in multiples to form a magnetic RAM including a plurality of memory cells.

Meanwhile, magnetic RAM including a plurality of memory cells is possible and preferable, as shown in FIG. 7. In FIG. 7, eight memory cells are illustrated as an example of a plurality of memory cells.

As shown in FIG. 7, the magnetic RAM according to the embodiment of the present invention has eight memory cells, in which the memory cells preferably share a second electrode terminal 350 or a third electrode terminal 550.

It is also preferable that the first electrode terminals 150 be provided in each of the memory cells. As shown in FIG. 7, the first electrode terminals 150 may be provided in up to a number corresponding to the number of memory cells.

As shown in FIG. 7, the magnetic RAM including the plurality of memory cells may be implemented by forming the plurality of cells in the upper part using the thermal electron injection layer 500, the spin-current generation layer 400, and the spin-current transfer layer 300 as a common base. An embodiment of the magnetic RAM in which a plurality of memory cells may be simultaneously driven is shown as an example, in which the magnetic RAM is configured such that a large number of memory cells is formed and the second electrode terminal 350 and the third electrode terminal 550 are commonly used.

In order to reduce the area of the magnetic RAM, one second electrode terminal 350 is formed over the spin-current transfer layer 300 and one third electrode terminal 550 is formed over the non-magnetic metal base layer 520.

Only the first electrode terminal 150 is connected to each memory cell to cause the plurality of memory cells to be operated. When information is written to an i-th memory cell in the magnetic RAM configured with N memory cells, a voltage pulse is first applied across the second electrode terminal 350 and the third electrode terminal 550 to generate thermal electrons, whereby the current consumed in switching each memory cell may be reduced.

Then, the magnetization direction of the free magnetic sub-layer 230 in each memory cell is set to be up or down by the polarity of the voltage pulse applied across the first electrode terminal 150-*i* (i is an integer) of the i-th memory cell and the second electrode terminal 350. It will be appreciated that reference numerals 150-1 to 150-8 denote the respective first electrode terminals of the first to eighth memory cells in FIG. 7.

When energy of 300 fJ is used to operate one memory cell according to the related art, energy of 300 fJ*N is consumed to operate N memory cells. When energy of 100 fJ is used to generate the thermal spin transfer torque in the common thermal electron injection layer 500 and the energy used to generate the current-driven spin transfer torque by the effect of the thermal spin transfer torque is reduced to 1/p, the energy used for one memory cell is determined to be (300 fJ*N/p+100 fJ)/N=300 fJ/p+100 fJ/N).

For example, when 10 memory cells are simultaneously driven and the switching energy of each cell is reduced to ⅕ by the thermal spin transfer torque, the switching energy used for one memory cell is determined to be 300 fJ/5+100 fJ/10=70 fJ. As a result, the memory cell of the magnetic RAM may be effectively operated using less energy than the related art.

As described above, in the related art, only the current-driven spin transfer torque is used to perform a write operation of the magnetic RAM, that is, magnetization direction switching. In contrast, in the magnetic RAM according to the present invention, a combination of thermal spin transfer torque and current-driven spin transfer torque is used to perform the write operation of the magnetic RAM. That is, the combination of the thermal spin transfer torque and the current-driven spin transfer torque results in switching the magnetization direction of the free magnetic sub-layer.

Since a combination of the thermal spin transfer torque and the current-driven spin transfer torque is used, there is an advantage in that the current density or consumed energy required for switching the magnetization direction in the magnetic RAM is reduced.

In addition, since the switching is performed by a combination of voltage pulses in two stages, there is an advantage in that an error rate is lowered even upon high-speed switching. That is, when switching the magnetic RAM using the current-driven spin transfer torque, the faster the switching time, the higher the error rate.

There is thus a problem in that high-speed switching is limited in order to suppress an increase in error rate in the related art, whereas there is an advantage in that the error rate is reduced so that high-speed switching below 1 nanosecond is possible, as described above, in the magnetic RAM according to the present invention.

Further, since a single voltage pulse is applied across the second electrode terminal and the first electrode terminal but the voltage pulse is not applied across the third electrode terminal and the second electrode terminal during a read operation of the magnetic RAM, it is possible to avoid the risk of causing a write operation during a read operation. Therefore, there is an advantage in that the accuracy and reliability of the magnetic RAM are increased.

The invention claimed is:

1. A magnetic RAM including a memory cell, the memory cell comprising:
   a metal layer provided with a first electrode terminal for receiving a first voltage pulse;
   a magnetic tunnel junction layer disposed in contact with a lower surface of the metal layer to store predefined information by causing a magnetization direction of at least a part thereof to be up or down;
   a spin-current transfer layer disposed in contact with a lower surface of the magnetic tunnel junction layer and provided with a second electrode terminal for receiving a second voltage pulse to transfer spin current to the magnetic tunnel junction layer;
   a spin-current generation layer disposed in contact with a lower surface of the spin-current transfer layer to generate the spin current to be transferred to the magnetic tunnel junction layer through the spin-current transfer layer; and
   a thermal electron injection layer disposed in contact with a lower surface of the spin-current generation layer and provided with a third electrode terminal for receiving a third voltage pulse to inject thermal electrons into the spin-current generation layer so that the spin current is generated in the spin-current generation layer,
   wherein the magnetization direction of at least a part of the magnetic tunnel junction layer is changed due to a spin transfer torque generated in at least the part of the magnetic tunnel junction layer by the spin current.

2. The magnetic RAM according to claim 1, wherein the metal layer or the spin-current transfer layer is configured to include a non-magnetic metal.

3. The magnetic RAM according to claim 2, wherein the magnetic tunnel junction layer includes:
   a fixed magnetic sub-layer including a magnetic metal;
   a free magnetic sub-layer provided below the fixed magnetic sub-layer and including a magnetic metal; and
   an insulating sub-layer located between the fixed magnetic sub-layer and the free magnetic sub-layer to insulate the fixed magnetic sub-layer and the free magnetic sub-layer from each other.

4. The magnetic RAM according to claim 3, wherein the fixed magnetic sub-layer is any one of FePt having a face-centered tetragonal (FCT) crystal structure, FePd having an FCT crystal structure, CoPt having an FCT crystal structure, $[Co/Pt]_N$ of a multi-layer thin film structure, $[Co/Pd]_N$ of a multi-layer thin film structure, $[Co/Ni]_N$ of a multi-layer thin film structure, CoFeB/Ta of a bi-layer structure, CoFeB/W of a bi-layer structure, and CoFeB/Hf of a bi-layer structure.

5. The magnetic RAM according to claim 3, wherein the free magnetic sub-layer is any one of FePt having an FCT crystal structure, FePd having an FCT crystal structure, CoPt having an FCT crystal structure, Co/Pt of a multilayer thin film structure, Co/Pd of a multilayer thin film structure, Co/Ni of a multilayer thin film structure, CoFeB/Ta of a bi-layer structure, CoFeB/W of a bi-layer structure, and CoFeB/Hf of a bi-layer structure.

6. The magnetic RAM according to claim 3, wherein the thermal electron injection layer includes:
   a base insulating layer disposed in contact with a lower surface of the spin-current generation layer; and
   a non-magnetic metal base layer provided below the base insulating layer and including a non-magnetic metal.

7. The magnetic RAM according to claim 6, wherein the spin-current generation layer is a magnetic metal layer including a magnetic metal.

8. The magnetic RAM according to claim 7, wherein a magnetization direction of the fixed magnetic sub-layer is perpendicular to a magnetization direction of the spin-current generation layer.

9. The magnetic RAM according to claim 8, wherein the spin-current generation layer is any one of Co, Fe, Ni, a CoFe alloy, a NiFe alloy, a CoFeAl alloy, a CoAl alloy, and a CoFeB alloy.

10. The magnetic RAM according to claim 8, wherein the spin current generated in the spin-current generation layer by a voltage pulse applied between the third electrode terminal and the second electrode terminal is transferred to the free magnetic sub-layer through the spin-current transfer layer so that the spin current torque is generated in the free magnetic sub-layer.

11. The magnetic RAM according to claim 10, wherein a voltage pulse is applied between the first electrode terminal and the second electrode terminal to allow the current-driven spin transfer torque due to current flowing from the first electrode terminal to the second electrode terminal to be applied to the free magnetic sub-layer, so that the magnetization direction of the free magnetic sub-layer is a downward direction.

12. The magnetic RAM according to claim 10, wherein a voltage pulse is applied between the first electrode terminal and the second electrode terminal to allow the current-driven spin transfer torque due to current flowing from the second electrode terminal to the first electrode terminal to be applied to the free magnetic sub-layer, so that the magnetization direction of the free magnetic sub-layer is an upward direction.

13. The magnetic RAM according to claim 8, wherein the spin current generated in the spin-current generation layer by a voltage pulse applied between the third electrode terminal and the first electrode terminal is transferred to the free magnetic sub-layer through the spin-current transfer layer so that the spin current torque is generated in the free magnetic sub-layer.

14. The magnetic RAM according to claim 13, wherein a voltage pulse is applied between the first electrode terminal and the second electrode terminal to allow the current-driven spin transfer torque due to current flowing from the first electrode terminal to the second electrode terminal to be applied to the free magnetic sub-layer, so that the magnetization direction of the free magnetic sub-layer is a downward direction.

15. The magnetic RAM according to claim 13, wherein a voltage pulse is applied between the first electrode terminal and the second electrode terminal to allow the current-driven spin transfer torque due to current flowing from the second electrode terminal to the first electrode terminal to be applied to the free magnetic sub-layer, so that the magnetization direction of the free magnetic sub-layer is an upward direction.

16. The magnetic RAM according to claim 1, wherein the memory cell further includes an electrode-insulating layer disposed between the first electrode terminal, the second electrode terminal, and the third electrode terminal so that the first electrode terminal, the second electrode terminal, and the third electrode terminal are insulated from each other so as to prevent current from directly flowing therebetween.

* * * * *